(12) United States Patent
Jung

(10) Patent No.: US 7,649,241 B2
(45) Date of Patent: Jan. 19, 2010

(54) SEMICONDUCTOR DEVICE AND METHOD OF MANUFACTURING THE SAME

(75) Inventor: Kyung Yun Jung, Kyounggi-Do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/743,113

(22) Filed: Dec. 22, 2003

(65) Prior Publication Data

US 2004/0129999 A1 Jul. 8, 2004

(30) Foreign Application Priority Data

Dec. 30, 2002 (KR) .................. 10-2002-0087274

(51) Int. Cl.
*H01L 29/00* (2006.01)
(52) U.S. Cl. .................. 257/530; 257/534; 438/131
(58) Field of Classification Search .................. 257/312, 257/528–530, 532; 438/379, 255, 957
See application file for complete search history.

(56) References Cited

U.S. PATENT DOCUMENTS

| 5,208,177 | A | * | 5/1993 | Lee ............................. | 438/239 |
| 5,248,632 | A | * | 9/1993 | Tung et al. .................. | 438/600 |
| 5,533,635 | A | * | 7/1996 | Man ............................ | 216/67 |
| 6,141,240 | A | * | 10/2000 | Madan et al. ............... | 365/156 |

(Continued)

FOREIGN PATENT DOCUMENTS

JP 11145414 5/1999

JP 2002-334928 A * 11/2002

OTHER PUBLICATIONS

S. Wolf, "Silicon Processing for the VLSI Era", vol. 3, Chapter 3, pp. 83-89; Lattice Press, Sunset Beach, CA (1995).*

(Continued)

*Primary Examiner*—Johannes Mondt
(74) *Attorney, Agent, or Firm*—Saliwanchik, Lloyd & Saliwanchik

(57) ABSTRACT

A semiconductor device having a variable capacitance capacitor and a method of manufacturing the same are disclosed. An example semiconductor device includes a capacitor having a bottom electrode, a dielectric layer and an upper electrode, formed on a semiconductor substrate. The example semiconductor also includes a first insulating layer formed on the semiconductor substrate to cover the capacitor, a plurality of first contact plugs formed in a plurality of first via holes of the first insulating layer, each of which is electrically connected to either the bottom electrode or the upper electrode, a first metal wiring formed on the first insulating layer and connected to the bottom electrode through the first contact plug, a second contact plug formed on the first insulating layer and connected to the upper electrode through the first contact plug, and a second insulating layer formed on the first insulating layer to cover the first metal wiring and the second contact plug. In addition, the example semiconductor device includes an anti-fuse formed in a certain thickness in a second via hole of the second insulating layer and electrically connected to the second contact plug, a third contact plug filling the second via hole on the anti-fuse, and a second metal wiring formed on the second insulating layer and electrically connected to the third contact plug.

10 Claims, 6 Drawing Sheets

U.S. PATENT DOCUMENTS

| | | | |
|---|---|---|---|
| 6,339,258 B1* | 1/2002 | Cooney et al. | 257/762 |
| 6,448,631 B2* | 9/2002 | Gandhi et al. | 257/635 |
| 6,495,426 B1 | 12/2002 | Cheng et al. | 438/393 |
| 6,861,686 B2* | 3/2005 | Lee et al. | 257/291 |
| 2001/0005604 A1* | 6/2001 | Lee et al. | 438/132 |
| 2001/0045667 A1* | 11/2001 | Yamauchi et al. | 257/774 |
| 2002/0015322 A1* | 2/2002 | Cloud et al. | 365/51 |
| 2002/0024083 A1* | 2/2002 | Noble et al. | 257/306 |
| 2002/0088998 A1* | 7/2002 | Knall et al. | 257/202 |
| 2004/0147087 A1* | 7/2004 | Cheng et al. | 438/396 |
| 2004/0217441 A1* | 11/2004 | Lehmann et al. | 257/530 |

OTHER PUBLICATIONS

S. Wolf, "Silicon Processing for the VLSI Era", vol. 3—"The submicron MOSFET", Lattice Press, Sunset Beach, California (USA), 1995; in particular Chapter 3, "MOS Transistor Device Physics: Part 1, Basic Physics and the MOS Capacitor", especially pp. 83-85.*

Gerstner, E.G., "Bistability in a-C for memory and antifuse applications", "Properties of Amorphous Carbon", Chapter 10, section 3 (10.3) in "Properties of Amorphous Carbon", Ed. by Silva, S., and Ravi, P., published by IEE (2005), especially, p. 318, on antifuse, see definition in the first paragraph.*

Computerized translation of Fukuzumi (JP 2002-334928A), from the Japan Patent Office.*

Computerized Translation of "Description of the Drawings", in Fukuzumi, JP 2002-34928. Source: On-line computerized translation from AIPN (Advanced Industrial Property Network), National Center for Industrial Property Information and Training, Japan Patent Office: http://dossier1.ipdl.inpit.go.jp/AIPN/odse_top_dn.ipdl?N0000=7400.*

Translation (manual) by the Translations Branch of the U.S. Patent & Trademark Office, of Fukuzumi (JP 2002-34928).*

* cited by examiner

SEMICONDUCTOR DEVICE AND METHOD OF MANUFACTURING THE SAME

RELATED APPLICATION

This application is related to Korean Patent Application No. 10-2002-0087274 filed on Dec. 30, 2002, which is incorporated herein by reference in its entirety.

FIELD OF THE DISCLOSURE

The present disclosure relates generally to semiconductor devices and, more particularly, to a semiconductor device having a variable capacitance capacitor and a method of manufacturing the same

BACKGROUND

Generally, a capacitor constitutes a unit cell of a semiconductor device together with a metal oxide semiconductor (MOS) transistor, providing a function of frequency modulation. As shown in FIG. 1, such a capacitor generally has a structure in which a bottom electrode 12, a dielectric layer 14, and an upper electrode 15 are successively formed on a semiconductor substrate 11. Recently, with a refinement of a design rule for semiconductor devices, the area occupied by the capacitor in the semiconductor device is reduced to enable the fabrication of a capacitor with a large capacitance in a reduced area. However, the conventional capacitor shown in FIG. 1 has a structure in which the bottom electrode 12 is formed in a planar shape, which limits the maximum capacitance that may be employed in a micro or semiconductor device.

To satisfy the need for a capacitor with large capacitance, at least one study has concentrated on development of a capacitor having increased capacitance in a unit area. As a result, as shown in FIG. 2, a method of maximizing a capacitance of capacitor in which a bottom electrode 22 has been formed as an uneven shape to increase an effective area contacting with a dielectric layer 23 has been proposed. In addition, a method of maximizing a capacitance by use of various capacitor structures has also been provided. However, because the conventional capacitor has a fixed capacitance, regardless of its capacitance level, it has a problem in adapting to a presently used semiconductor device having a multi-function.

DETAILED DESCRIPTION

As described in greater detail below, an example semiconductor device includes a capacitor having a bottom electrode, a dielectric layer and an upper electrode, formed on a semiconductor substrate. The example semiconductor device also includes a first insulating layer formed on the semiconductor substrate to cover the capacitor, a plurality of first contact plugs formed in a plurality of first via holes of the first insulating layer, each of which is electrically connected to either the bottom electrode or the upper electrodes, a first metal wiring formed on the first insulating layer and electrically connected to the bottom electrode through the first contact plug, and a second contact plug formed on the first insulating layer and electrically connected to the upper electrode through the first contact plug. Still further, the example semiconductor device includes a second insulating layer formed on the first insulating layer to cover the first metal wiring and the second contact plug, an anti-fuse formed in a certain thickness in a second via hole of the second insulating layer and electrically connected to the second contact plug, a third contact plug filling the second via hole on the anti-fuse, and a second metal wiring formed on the second insulating layer and electrically connected to the third contact plug. Preferably, the first and second metal wirings are perpendicular to each other.

A example method of manufacturing the example semiconductor device includes forming a capacitor having a bottom electrode, a dielectric layer and an upper electrode on a semiconductor substrate; forming a first insulating layer on the semiconductor substrate to cover the capacitor; forming a plurality of first via holes exposing the surfaces of the bottom and upper electrodes by selectively patterning the first insulating layer; forming a plurality of first contact plugs by filling the via holes with metal materials; forming a first metal wiring connected to the bottom electrode through the first contact plug and a second contact plug connected to the upper electrode through the first contact plug on the first insulating layer; forming a second insulating layer on the first insulating layer to cover the first metal wiring and the second contact plug; forming a plurality of second via holes exposing the surface of the second contact plug by selectively patterning the second insulating layer; successively depositing the first and second metal layers on the second insulating layer including the second via hole; forming an anti-fuse and a third contact plug in the second via hole by planarizing the first and second metal layers with the second insulating layer; and forming a second metal wiring electrically connected to the anti-fuse and the third contact plug.

Using the example methods and apparatus described herein, the capacitance of a capacitor may be varied via a program, for example.

Figure 1:
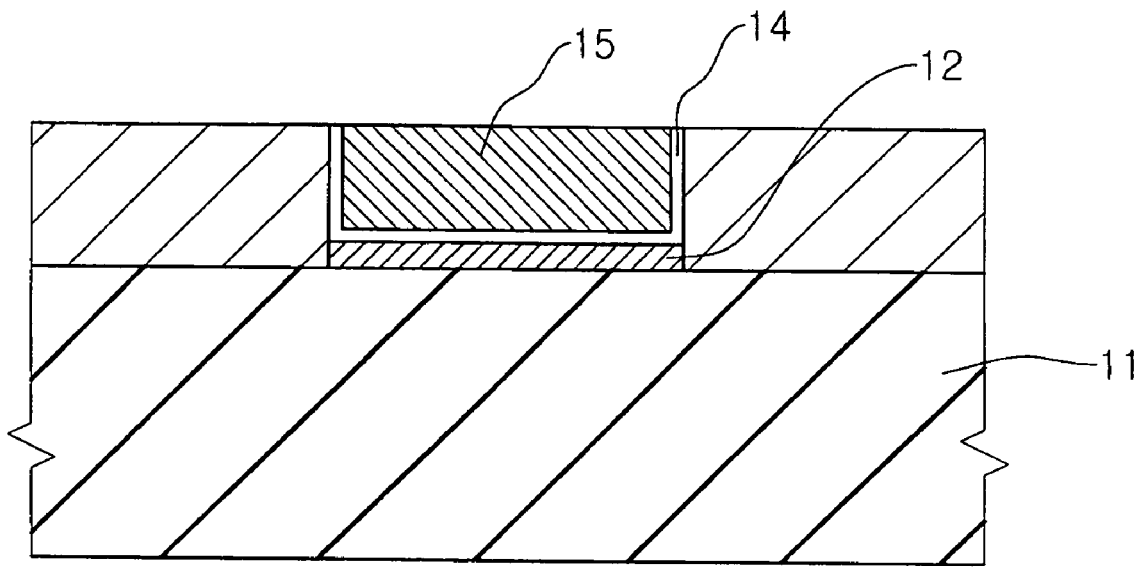
FIG. 1 is a cross-sectional view of a known capacitor structure.
Figure 2:
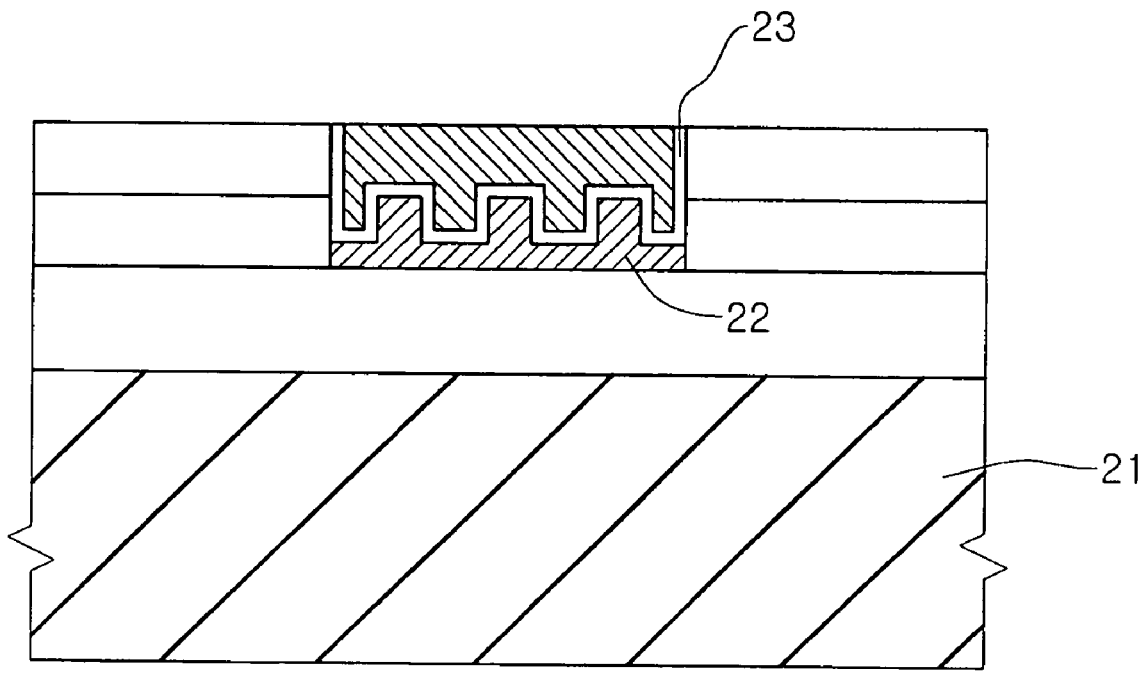
FIG. 2 is a cross-sectional view of another known capacitor structure.
Figure 3:
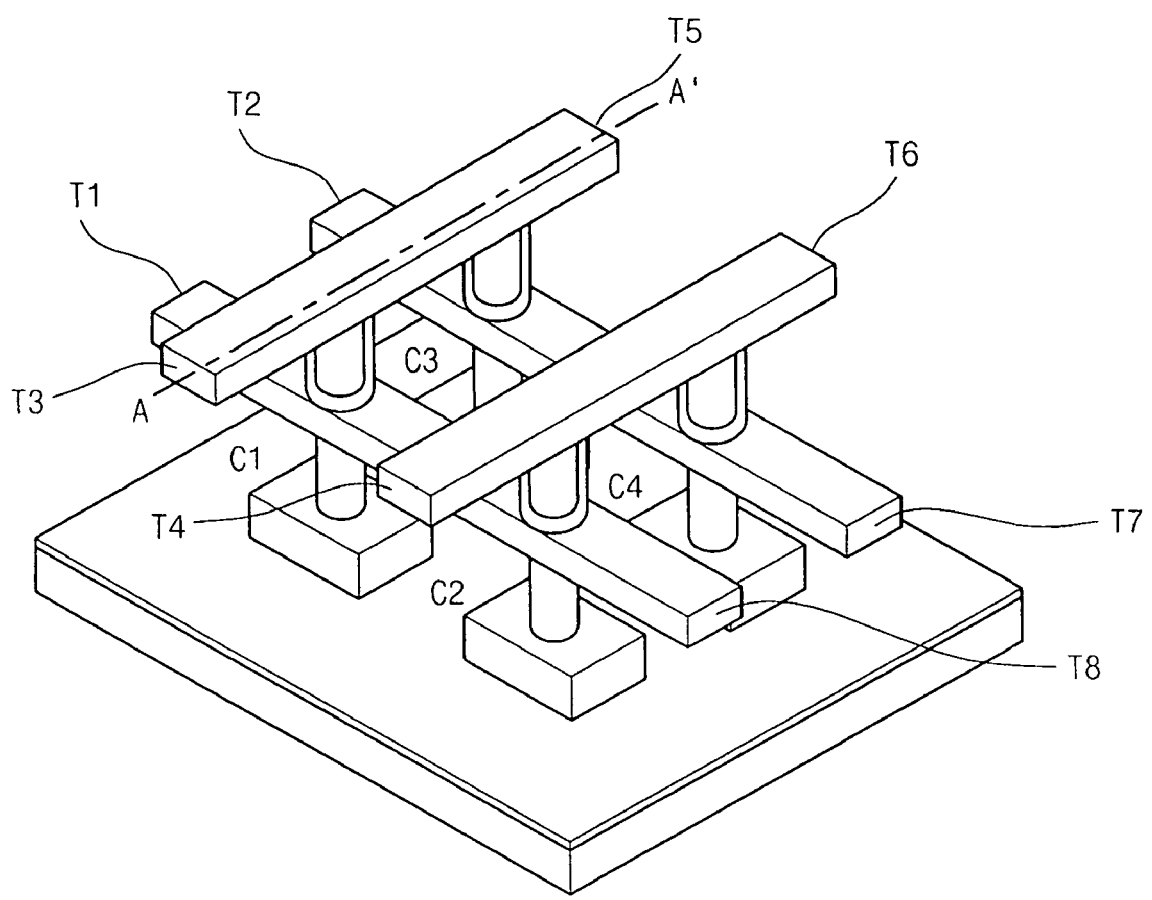
FIG. 3 is a perspective view of an example semiconductor device.
Figure 4:
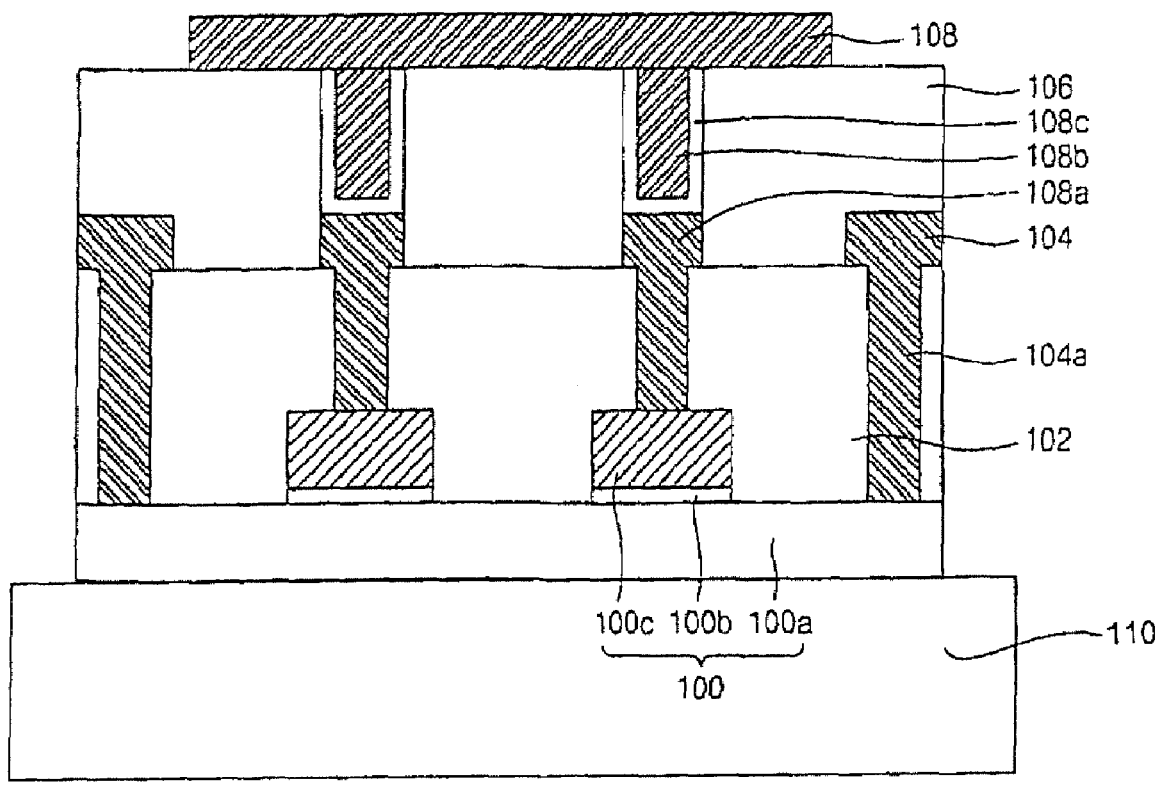
FIG. 4 is a cross-sectional view taken along a line of A-A' of FIG. 3.

FIG. 3 is a perspective view of an example semiconductor device and FIG. 4 is a cross-sectional view taken along a line of A-A' of FIG. 3. As shown in FIGS. 3 and 4, an example semiconductor device includes a capacitor having a bottom electrode, a dielectric layer and an upper electrode, successively formed on a semiconductor substrate 110. A first insulating layer 102 is formed on the semiconductor substrate 110 to cover the upper electrode 100c. A plurality of via holes exposing the bottom and upper electrodes are formed on a certain portion of the first insulating layer and first contact plugs 104a are formed by filling the plurality of via holes with metal material.

A first metal wiring electrically connected to the bottom electrode 100a through the first contact plug 104a is formed on one side of the first insulating layer 102 and a plurality of second contact plugs 108a electrically connected to the upper electrode 100c through the first contact plug 104a are formed on the other side of the first insulating layer 102.

A second insulating layer 106 is formed on the semiconductor substrate 110 to cover the first metal wiring 104 and the second contact plug 108a. A plurality of via holes exposing the second contact plugs 108a are formed on a certain portion of the second insulating layer 106 and anti-fuse 108c is formed in a certain thickness in each via hole. A third contact plug 108b is formed on the anti-fuse, which serves to vary the capacitance. A second metal wiring 108 electrically connected to the third contact plug 108b is formed on the second insulating layer covering the third contact plug 108b.

FIGS. 5A to 5D are cross-sectional views depicting an example method of manufacturing the example semiconductor device described herein.

Figure 5A:
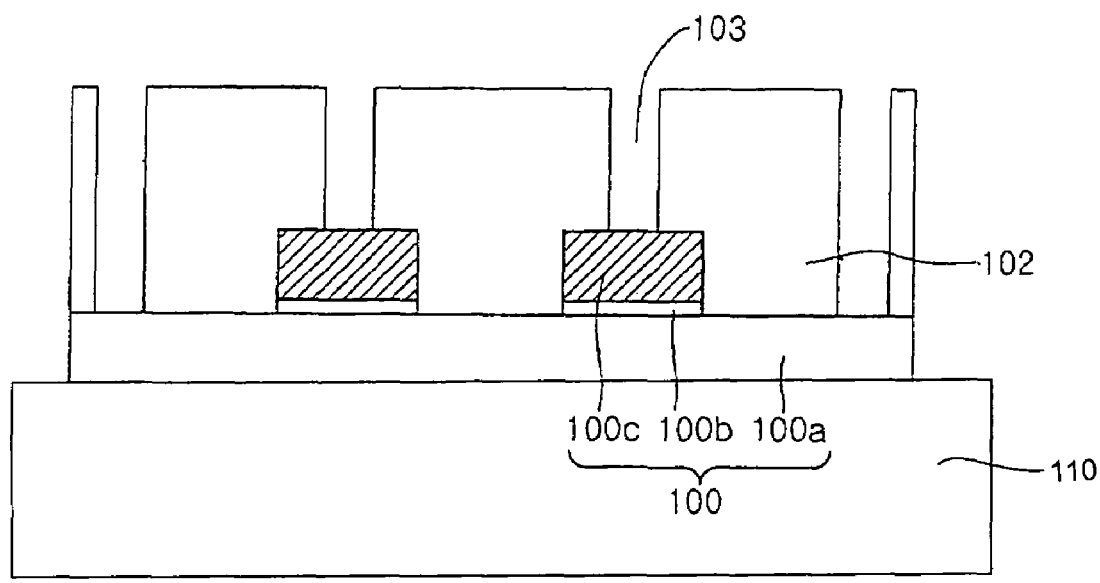
FIGS. 5A to 5D are cross-sectional views depicting an example method of manufacturing a semiconductor device.

First, as shown in FIG. 5A, using a conventional capacitor formation process, a capacitor 100 having a bottom electrode 100a, a dielectric layer 100b and an upper electrode 100c is formed on a semiconductor substrate (not shown). The upper and bottom electrodes 100c and 100a may be formed of a poly silicon layer or a metal layer.

Then, a first insulating layer 102 is formed on the semiconductor substrate 110 including the upper electrode 100c. Successively, a photoresist (not shown) is coated on the first insulating layer 102, and the first insulating layer 102 is selectively etched and removed by a conventional photolithography process and an etching process. As a result, a first via hole 103 exposing the surfaces of the bottom and upper electrodes, is formed by the selective etching of the first insulating layer 102.

Figure 5B:
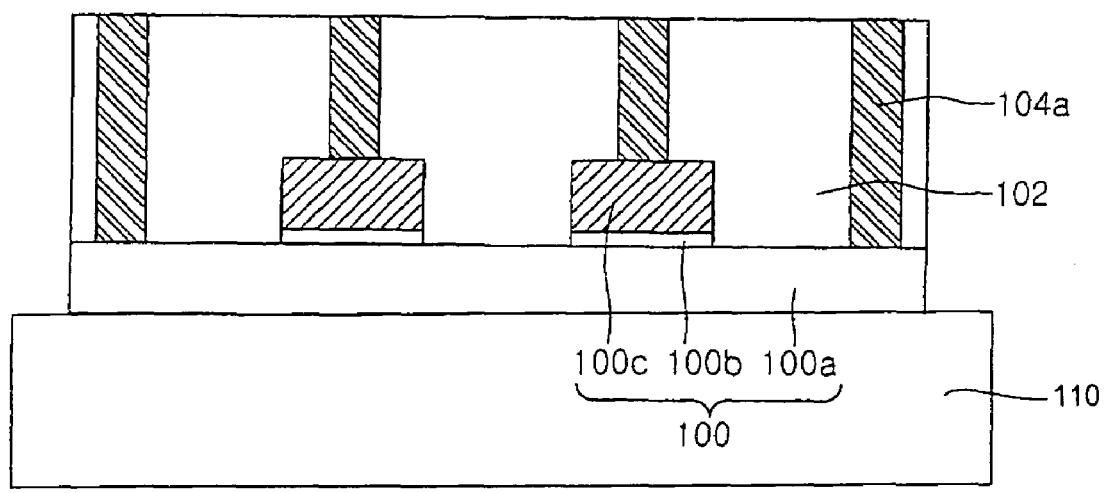

In such state, as shown in FIG. 5B, a metal layer such as tungsten layer is deposited on the first insulating layer 102 to sufficiently fill the first via hole 103. Then, using a chemical mechanical polishing (CMP) process, the tungsten layer is planarized with the first insulating layer 102, so that a first contact plug 104a that fills the first via hole with the metal layer is formed.

Figure 5C:
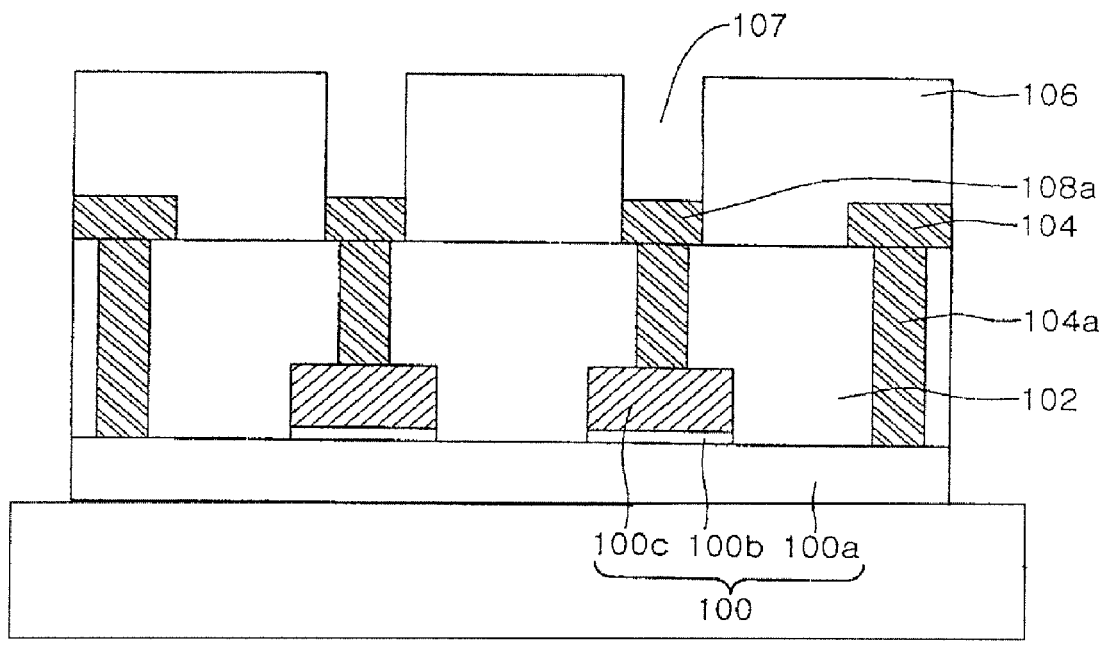

Then, as shown in FIG. 5C, a metal layer for forming a first metal wiring is deposited on the first insulating layer 102 and on the first contact plug 104a, by using such as a sputtering process. Then, the metal layer for the first metal wiring is selectively patterned by a photolithography and an etching process, thus forming a first metal wiring 108a and a second contact plug 104 electrically connected to the different first contact plug 104a, respectively.

Then, a second insulating layer 106 is deposited on the first insulating layer to cover the first metal wiring 104 and the second contact plug 108a. Then, a photoresist (not shown) is coated on the second insulating layer, and the second insulating layer 106 is selectively etched and removed by a conventional photolithography process and an etching process, thus forming a second via hole 107. A surface of the second contact plug 108a is exposed by the second via hole 107.

Figure 5D:
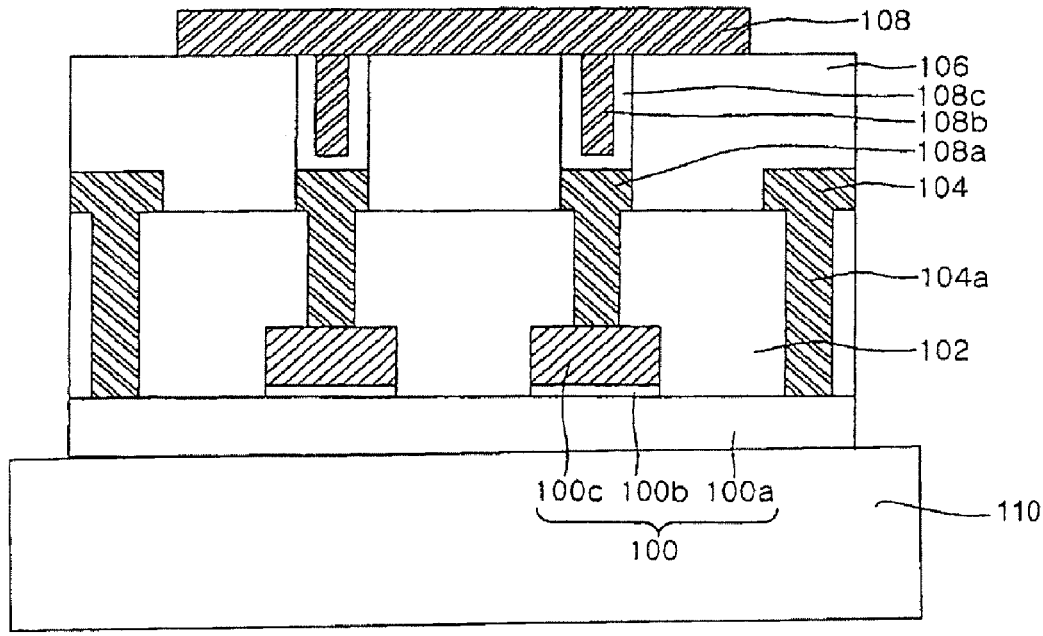

In a state that the second via hole 107 has been formed, as shown in FIG. 5D, a metal layer, i.e., a first metal layer for forming an anti-fuse is formed in a certain thickness on the semiconductor substrate including in the second via hole 107. Then, a conductive metal layer, i.e., a second metal layer is formed on the semiconductor substrate including the first metal layer to sufficiently fill the second via hole. Then, the first metal layer and second metal layer are planarized with the second insulating layer 106. Thus, the anti-fuse 108c is formed in the second via hole 107 and a third contact plug 108b, which is narrower in width than the second contact plug 108a, is formed inside the anti-fuse.

Figure 6:
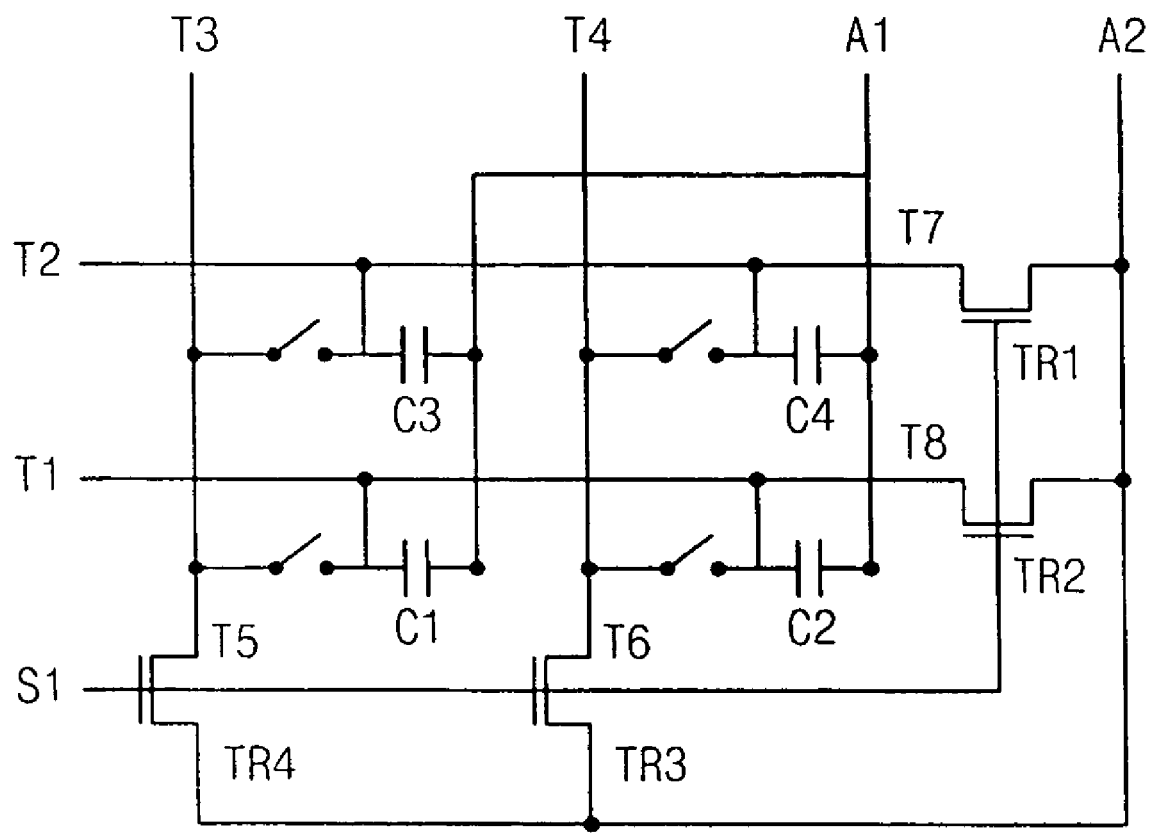
FIG. 6 is a circuit diagram depicting one manner in which the semiconductor device of FIG. 3 may be used.

FIG. 6 is an example circuit diagram for illustrating the operation of the semiconductor device of FIG. 3. The construction of the circuit diagram of FIG. 6 is similar or identical to that of FIG. 3.

First, a specific capacitance of the capacitor is predetermined. For example, an example in which the capacitance is equal to C1+C2+C3 is described below.

Because a program is not operating, transistors TR1, TR2, TR3 and TR4 are in an off state by signal S1 and a stored capacitance between A1 and A2 is equal to zero. Herein, T1, T2, T3 and T4 are input signals for selecting one capacitor and for programming an anti-fuse switch.

A programmable (e.g., controlled by a program) voltage is applied between T1 and T3 to turn the anti-fuse connected to C1 on. Then, TR1, TR2, TR3 and TR4 are turned on by S1. Herein, the stored capacitance between A1 and A2 is equal to C1. Then, programmable voltage is applied between T1 and T4 so as to connect C2. Then, TR1, TR2, TR3 and TR4 are turned on by S1. Herein, the stored capacitance between A1 and A2 is equal to C1+C2. Successively, programmable voltage is applied between T2 and T3 to connect C3. Then, TR1, TR2, TR3 and TR4 are turned on by S1. Herein, the stored capacitance between A1 and A2 is equal to C1+C2+C3. In this manner, the capacitance may be varied (e.g., by a user) as desired via a program or the like.

Although certain methods and apparatus have been described herein, the scope of coverage of this patent is not limited thereto. To the contrary, this patent covers all embodiments fairly falling within the scope of the appended claims either literally or under the doctrine of equivalents.

What is claimed is:

1. A semiconductor device, comprising:
   a capacitor having a bottom electrode, a dielectric layer formed on the bottom electrode, and an upper electrode formed on the dielectric layer, the capacitor being formed on a semiconductor substrate;
   a first insulating layer formed on the semiconductor substrate to cover the capacitor;
   a plurality of first contact plugs formed in a plurality of first via holes of the first insulating layer, each of the plurality of first contact plugs being electrically connected to either the bottom electrode or the upper electrode;
   a first metal wiring formed on the first insulating layer and connected to the bottom electrode through one of the first contact plugs;
   a second insulating layer formed on the first insulating layer;
   a second contact plug in the second insulating layer formed on the first insulating layer and connected to the upper electrode through another one of the first contact plugs;
   an anti-fuse formed on the second contact plug in a second via hole of the second insulating layer;
   a third contact plug filling the second via hole and formed within the anti-fuse, wherein the third contact plug does not directly contact the second insulating layer; and
   a second metal wiring formed on the second insulating layer and electrically connected to the third contact plug and the anti-fuse.

2. The semiconductor device of claim 1, wherein the first and second metal wirings are arranged perpendicular to each other.

3. A method of manufacturing a semiconductor device, comprising:
   forming a capacitor having a bottom electrode, a dielectric layer formed on the bottom electrode and an upper electrode formed on the dielectric layer on a semiconductor substrate;
   forming a first insulating layer on the semiconductor substrate to cover the capacitor;
   forming a plurality of first via holes exposing surfaces of the bottom electrode and the upper electrode by selectively patterning the first insulating layer;
   forming a plurality of first contact plugs by filling the first via holes with metal materials;

forming first metal wiring connected to the bottom electrode through one of the plurality of first contact plugs and forming a second contact plug connected to the upper electrode through another one of the plurality of first contact plugs, on the first insulating layer;

forming a second insulating layer on the first insulating layer;

forming a second via hole exposing a surface of the second contact plug by selectively patterning the second insulating layer;

successively depositing first and second metal layers on the second insulating layer including the second via hole;

forming an anti-fuse on the second contact plug in the second via hole and a third contact plug within the anti-fuse by planarizing the first and second metal layers with the second insulating layer; and forming second metal wiring electrically connected to the anti-fuse and the third contact plug, on the second insulating layer.

4. The semiconductor device of claim 1, wherein the anti-fuse is formed between the second contact plug and third contact plug and between the second insulating layer and third contact plug.

5. The semiconductor device of claim 1, wherein the upper surface of the third contact plug and the upper surface of the second insulating layer are in the same horizontal plane.

6. The semiconductor device of claim 1, wherein the width of the third contact plug is narrower than the width of the second contact plug.

7. The method of claim 3, wherein the anti-fuse is formed between the second contact plug and third contact plug and between the second insulating layer and third contact plug.

8. The method of claim 3, wherein the third contact plug is not directly contacted with the second insulating layer.

9. The method of claim 3, wherein the upper surface of the third contact plug and the upper surface of the second insulating layer are formed in the same horizontal plane.

10. The method of claim 3, wherein the width of the third contact plug is narrower than the width of the second contact plug.

* * * * *